United States Patent
Jagiella et al.

(10) Patent No.: US 7,243,553 B2
(45) Date of Patent: Jul. 17, 2007

(54) SENSOR DEVICE FOR THE EXAMINATION OF SURFACES

(75) Inventors: Manfred Jagiella, Notzingen (DE); Sorin Fericean, Leonberg (DE)

(73) Assignee: Balluff GmbH, Neuhausen (DE)

( * ) Notice: Subject to any disclaimer, the term of this patent is extended or adjusted under 35 U.S.C. 154(b) by 48 days.

(21) Appl. No.: 11/051,062

(22) Filed: Feb. 3, 2005

(65) Prior Publication Data

US 2005/0172726 A1 Aug. 11, 2005

(30) Foreign Application Priority Data

Feb. 9, 2004 (DE) .................... 10 2004 006 680

(51) Int. Cl.
  *G01B 7/16* (2006.01)
(52) U.S. Cl. ........................................ 73/779
(58) Field of Classification Search ................ 73/779, 73/866.5
  See application file for complete search history.

(56) References Cited

U.S. PATENT DOCUMENTS

| | | |
|---|---|---|
| 3,327,584 A | 6/1967 | Kissinger |
| 4,199,258 A | 4/1980 | Dau |
| 4,465,374 A | 8/1984 | Pryor et al. |
| 4,567,347 A | 1/1986 | Ito et al. |
| 4,777,769 A | 10/1988 | McLaughlin et al. |
| 4,824,248 A | 4/1989 | Neumann |
| 4,894,597 A | 1/1990 | Ohtomi |
| 4,942,672 A | 7/1990 | Yoshida |
| 4,967,092 A | 10/1990 | Fraignier et al. |
| 5,243,265 A | 9/1993 | Matsuuura et al. |
| 5,302,894 A | 4/1994 | Hrubes |
| 5,473,156 A | 12/1995 | Pinnock et al. |
| 5,479,929 A * | 1/1996 | Cooper et al. ............... 600/459 |
| 5,485,082 A | 1/1996 | Wisspeintner et al. |
| 5,942,693 A | 8/1999 | Harms et al. |
| 6,097,190 A * | 8/2000 | Foerster ....................... 324/329 |
| 6,155,757 A | 12/2000 | Neumann |
| 6,628,408 B1 | 9/2003 | Franklin et al. |
| 6,867,586 B2 * | 3/2005 | Hatcher et al. .............. 324/239 |

(Continued)

FOREIGN PATENT DOCUMENTS

| | | |
|---|---|---|
| DE | 38 39 386 | 5/1990 |
| DE | 39 10 297 | 10/1990 |
| DE | 40 40 084 | 6/1992 |
| DE | 41 02 721 | 8/1992 |
| DE | 42 17 292 | 12/1993 |
| DE | 42 31 989 | 1/1994 |

(Continued)

OTHER PUBLICATIONS

*Patent Abstracts of Japan*, Abstract of Japanese Patent "Burr Removing Robot Control Method", Publication No. 04310360, Nov. 2, 1992, Japanese Application No. 03072794, Filed Apr. 5, 1991.

(Continued)

*Primary Examiner*—Max Noori
(74) *Attorney, Agent, or Firm*—Lipsitz & McAllister, LLC

(57) ABSTRACT

A sensor device for examining the surfaces of a work piece, in particular in regard to burrs, is provided wherein said device comprises a probe shaft having a detector head with at least one inductive element, wherein said at least one inductive element couples inductively to the work piece, and wherein the at least one inductive element is constructed and arranged in such a manner that, with respect to a longitudinal axis of the probe shaft, the detector head has a field of view surrounding the probe shaft.

49 Claims, 7 Drawing Sheets

U.S. PATENT DOCUMENTS

2002/0135361 A1    9/2002    Jagiella et al.
2004/0051520 A1    3/2004    Jagiella et al.
2004/0102804 A1*    5/2004    Chin .......................... 606/190
2004/0136010 A1    7/2004    Jensen et al.

FOREIGN PATENT DOCUMENTS

| DE | 42 32 837 | 3/1994 |
|---|---|---|
| DE | 196 24 233 | 10/1997 |
| DE | 198 47 365 | 5/2000 |
| DE | 198 53 302 | 5/2000 |
| DE | 101 03 177 | 8/2002 |
| DE | 102 32 131 | 11/2003 |
| EP | 0 557 558 | 9/1993 |
| GB | 794985 | 5/1958 |
| JP | 363058134 A | 3/1988 |

OTHER PUBLICATIONS

*Patent Abstracts of Japan*, Abstract of Japanese Patent "Method and Device of Detecting Casting Skin Surface Around Burr in Casting Burr Removing Work", Publication No. 63174857, Jul. 19, 1988, Japanese Application No. 62008545, Filed Jan. 16, 1987.

*Patent Abstracts of Japan*, Abstract of Japanese Patent "Method for Measuring Burr Shape and Dimensions Generated on Plate Shear", Publication No. 06066536, Mar. 8, 1994, Japanese Application No. 04245804, Filed Aug. 21, 1992.

*Patent Abstracts of Japan*, Abstract of Japanese Patent "Automatic Shape Tolerance Measuring Method and Its Measuring Instrument", Publication No. 61111410, May 29, 1986, Japanese Application No. 59232367, Filed Nov. 6, 1984.

Extract from Delphion database relating to *JP 2051001*, "Method and Device for Measuring Height of Burr", Issued Feb. 21, 1990, Japanese Application No. 1988000200034, Filed Aug. 12, 1988.

Extract from Delphion database relating to *JP 11153414*, "Measuring Method of Burr Height and Mold Deviation of Molding", Issued Jun. 8, 1999, Japanese Application No. 1997000362423, Filed Nov. 21, 1997.

* cited by examiner

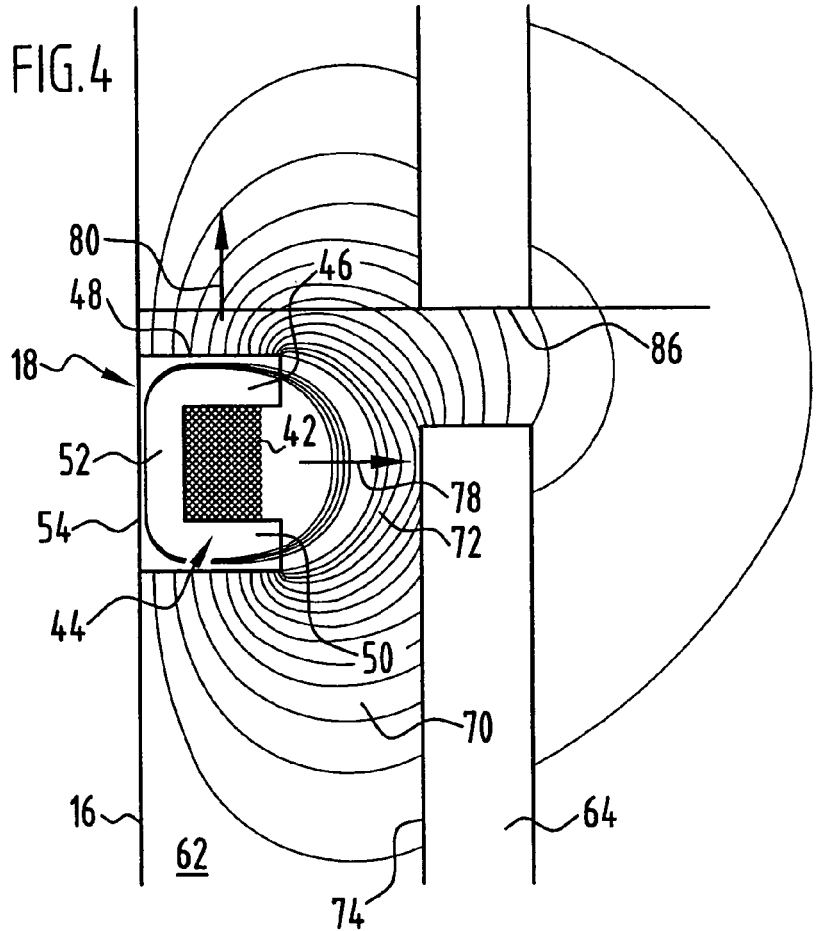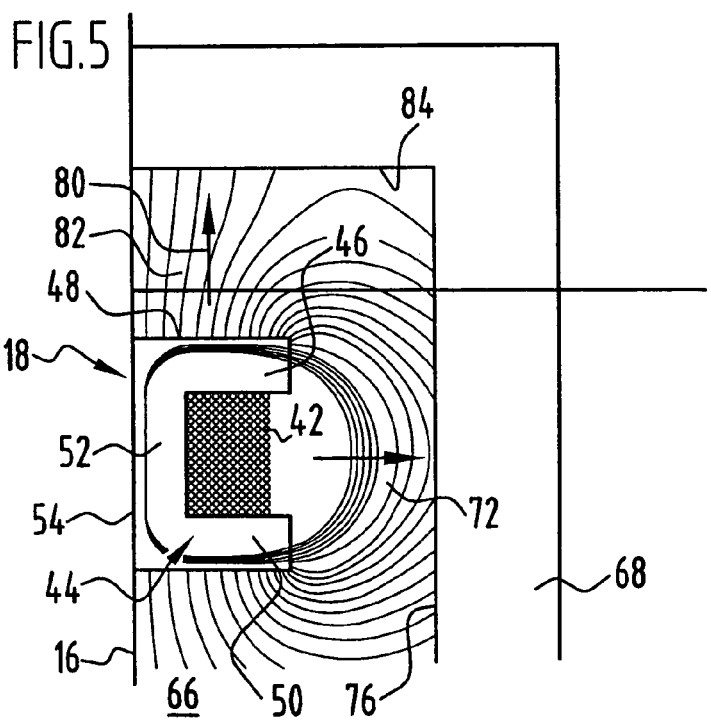

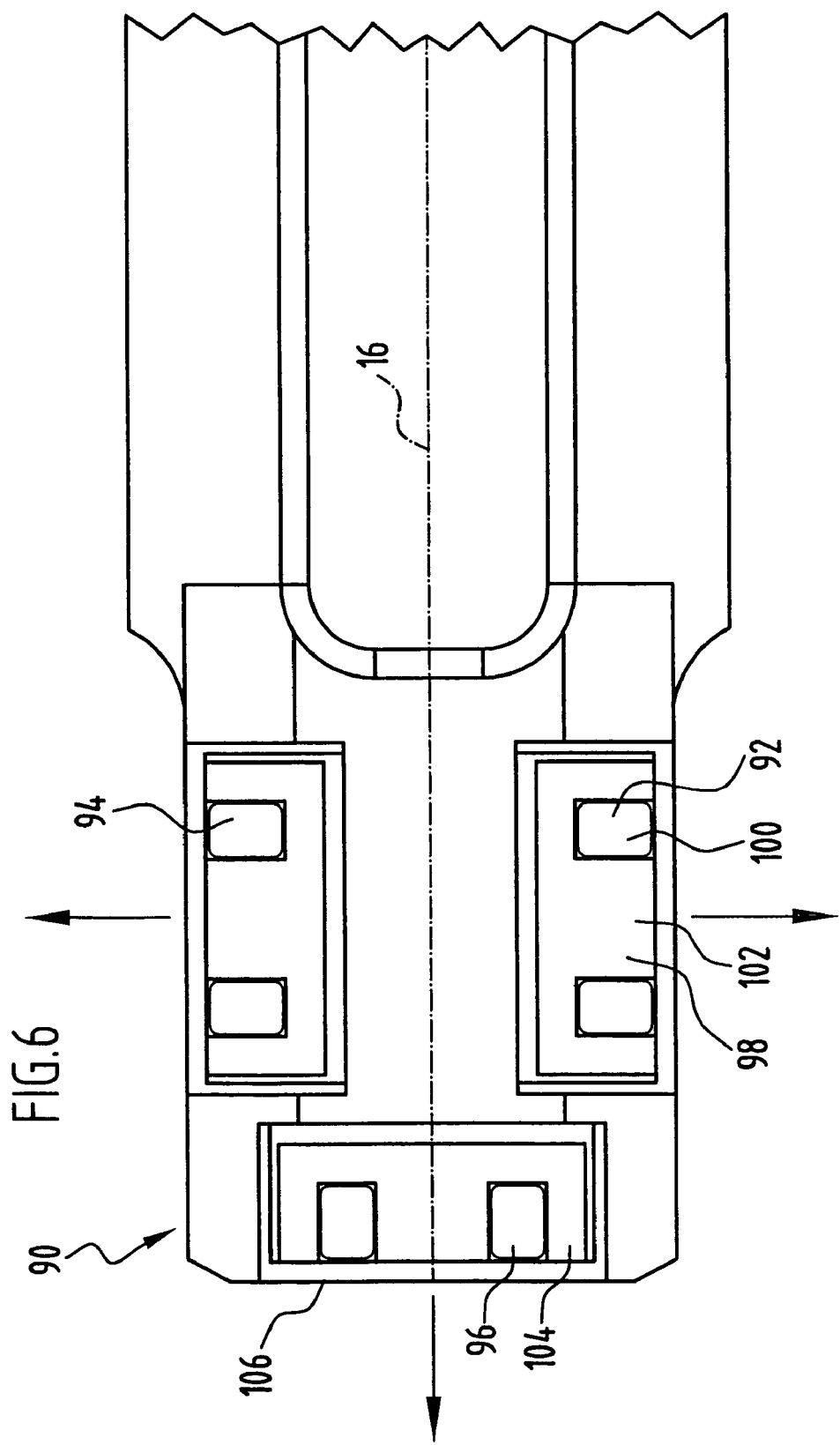

SENSOR DEVICE FOR THE EXAMINATION OF SURFACES

The present disclosure relates to the subject matter disclosed in German application No. 10 2004 006 680.9 of Feb. 9, 2004, which is incorporated herein by reference in its entirety and for all purposes.

BACKGROUND OF THE INVENTION

The invention relates to a sensor device for examining the surfaces of a work piece, in particular in regard to burrs, and which comprises a probe shaft having a detector head with at least one inductive element, said inductive element coupling inductively to the work piece.

A burr-checking sensor device for checking for burrs on a work piece is known from DE 101 03 177 A1 and U.S. 2002/0135361 A1 wherein the device comprises at least one distance-sensing sensor having a detector head and said detector head is positionable at a distance from the work piece and wherein the detector head and the work piece are moveable relative to one another. The detector head is coupled electromagnetically to the work piece or the work piece is adapted to be irradiated by an electromagnetic signal from said detector head. The coupling to the work piece or an electromagnetic reaction signal from the work piece in response to said electromagnetic signal depends on the distance between the detector head and the work piece so that this distance is determinable in non-contact-making manner and the surface of a work piece is adapted to be scanned in non-contact-making manner by the detector head.

SUMMARY OF THE INVENTION

In accordance with the invention, a sensor device is provided with which the surfaces of a work piece can be examined in a simple manner.

In accordance with the invention, the sensor device comprises at least one inductive element which is constructed and arranged in such a manner that the detector head has a field of view surrounding the probe shaft with regard to the longitudinal axis of the probe shaft.

The surface of a work piece can be scanned in non-contact-making (contact-free) manner by means of the detector head using the probe shaft. In particular, the detector head can be inserted into a recess and especially into a bore in a work piece in order to enable the internal surfaces of the work piece at the recess to be examined. Because the field of view surrounds the detector head, a global field of view effective in different radial directions is made available. It is thereby possible to effect the examination from different sides.

Due to the surrounding field of view, it is possible to centre the probe shaft together with the detector head in the recess so as, for example, to enable an optimised burr examination process or burr detection process to be carried out.

Due to the surrounding field of view and by means of the detector head, it is also possible for the diameter of the recess into which the detector head is inserted to be determined in the vicinity of the detector head.

In accordance with the invention, it is possible to carry out a global scan of a recess in a work piece. For example, this enables a burr examination process to be carried out in a minimal amount of time.

In particular, the coupling of the detector head to the work piece depends on the distance between the detector head and the work piece. Thus, an examination can be carried out in non-contact-making manner and in particular, burrs can be detected in a non-contact-making manner.

It is expedient for the detector head to be in the form of a distance detector comprising one or more distance sensors. Distances can then of course be determined in non-contact-making manner with the aid of the distance detector. In turn, protuberances on the surfaces and in particular on the internal surfaces such as burrs for example can then be detected and these protuberances such as burrs can be classified in dependence on the extent to which they affect the detector signal.

It is expedient if the at least one inductive element is constructed and arranged in such a manner that the distance to the work piece is determinable in radial directions. An examination can thereby be effected from different sides. This, for example, enables the detector head to be positioned coaxially in a recess or makes it possible for the diameter to be determined.

It is expedient if the field of view (the global field of view) then comprises a plurality of sight directions transverse to the longitudinal direction of the probe shaft.

An examination of the internal surfaces of the work piece can then be effected along the sight directions when the detector head is positioned in an appropriate manner.

Provision may be made for the field of view to extend around the detector head over a range of 360°. This then results in a (global) field of view which surrounds the detector head so that an examination can be effected on all sides.

Provision may be made for the field of view to be substantially rotationally symmetrical with respect to the longitudinal axis of the sensor shaft. Thus, in particular, coaxial positioning relative to the bore can be carried out in a simple manner in the case of a rotationally symmetric bore. It is also possible to determine the diameter of the boring (in the vicinity of the detector head) in a simple manner.

In particular, the at least one inductive element produces an electromagnetic field which is effective about the detector head in all transverse directions taken with reference to the longitudinal direction of the probe shaft. This electromagnetic field, with the aid of which the inductive coupling between the inductive element and the (metallic) work piece is effected, defines the field of view of the sensor device.

Provision may be made for the electromagnetic field around the detector head to be continuously interconnected and also for the field of view around the detector head to be continuously interconnected. An examination from all sides, without gaps therein, can thus be achieved.

It is expedient, if an active surface of the detector head via which the detector head is coupled to the work piece comprises a circumferential surface of the detector head. The circumferential surface may be closed. A global field of view which surrounds the detector head and has a large area of incidence on the work piece is thereby obtained.

It is expedient, if the at least one inductive element is constructed and arranged in such a manner that there is a field of view which extends forwardly from a distal end of the probe shaft. This thus results in an extended field of view, i.e. a forward field of view also exists in addition to the lateral field of view. In consequence, the base of a bore can be examined for example. It is also possible to determine the distance to the base of a bore using the forward field of view for example. The probe shaft and the detector head can thereby be prevented from striking heavily against the base when the probe shaft is inserted into the bore and is displaced too far forwardly therein.

It is expedient, if the forward field of view has a sight direction substantially parallel to the longitudinal axis of the probe shaft. An examination can then of course be effected in the forward direction in order to carry out a distance measurement for example.

It is then expedient, if an active surface, via which the detector head is coupled to the work piece, at least partly comprises an end face of the detector head. Examination in the forward direction is thereby made possible.

In this connection, it is expedient if the detector head is arranged in the vicinity of a distal end of the probe shaft or if the detector head forms the distal end of the probe shaft. It is thereby also possible to carry out an examination in the forward direction.

It is expedient, if the at least one inductive element is in the form of a toroidal coil. An optimised field of view for the detector head can then be produced in combination with an appropriate coil core.

It is expedient, if the at least one inductive element is arranged on a roll core. An inductive element in the form of a coil on such a roll core produces an electromagnetic field which surrounds the roll core (i.e. is effective radially outwardly) and is effective in the forward direction, i.e. produces a forward field of view. In particular, a detector head having a large field of view can then be produced by means of a single inductive element having a roll core. The detector head can be of small diameter so that, in turn, a probe of small diameter can be produced. In consequence, borings of small diameter can also be examined. For example, a sensor device having a maximum diameter of the probe shaft in the region of 3 mm was realized by means of a roll core.

If a longitudinal axis of the roll core is aligned substantially parallel to the longitudinal axis of the probe shaft, then a forward field of view and a field of view surrounding the probe shaft can thereby be set up.

It is expedient in this connection, if a coil axis of the at least one inductive element is substantially coaxial with the longitudinal axis of the roll core just in order to provide the desired range for the field of view.

It is expedient for the roll core to comprise an active rim which is oriented towards one end of the detector head or forms an end of the detector head. An electromagnetic field is guided forwardly by means of this active rim in order to produce the forward field of view.

Furthermore the roll core may comprise a passive rim which is located opposite the active rim.

This passive rim can be at least partly metallised in order to provide a corresponding field configuration by means of which the optimised (radial) range for the field of view can be set.

It is also possible for the passive rim to carry at least a part of an evaluating circuit. The passive rim can then form a base for holding the evaluating circuit. The space required in the probe shaft can thereby be minimized. In addition, the manufacturing process can be simplified by such a positioning of the evaluating circuit on the passive rim since the evaluating circuit does not have to be installed in a cavity in the probe shaft.

Provision may be made for the inductive element to be encapsulated on the roll core. Then, especially if the roll core is made of an electrically non-conductive material, there is no necessity for a separate protective cap and, in addition, the roll core itself does not have to be sleeved. In turn, the diameter of the detector head can thereby be minimized.

Provision may be made for the core to be made of an electrically non-conductive material. (However, it must still be made of a magnetically conductive material.)

In principle, it is also possible for the core to be made of an electrically conductive material (and magnetically conductive material). In consequence, it is also possible to use the core as an electrode for the purposes of determining the distance capacitivly for example. In turn, it is thereby possible to determine the distance between the detector head and the work piece inductively, to determine it capacitively or to determine it using a combination of inductive and capacitive processes. This thereby results in an extended number of ways for effecting a measurement or an evaluation for the purposes of examining the internal surfaces of a work piece.

Provision may be made for a screen for the core. The (electromagnetic) screen shapes the electromagnetic field to which the work piece is subjected by the detector head. An optimised field pattern can then be set by appropriate choice of the screen.

In particular, the screen surrounds the core so as to enable a field of view having an optimised field pattern to be generated around the probe shaft.

Provision may be made for the screen to be substantially rotationally symmetrical but with a break in the symmetry. This break in the symmetry enables the angular position of the probe shaft to be determined absolutely.

Such a break in the symmetry can be produced in a simple manner by means of a slit in the screen.

In particular, in connection with a roll core, it is possible for the detector head to comprise a single inductive element in the form of a field-generating element.

However, it is also possible for a plurality of inductive elements to be arranged in the detector head in order to provide a surrounding field of view.

It is then expedient, if a plurality of inductive elements distributed around the longitudinal axis of the probe shaft is arranged in the detector head in order thus to provide a global field of view by combining the local fields of view of the plurality of inductive elements.

It is possible for the respective inductive elements to be arranged on a pot core. An optimised field direction especially laterally with respect to the probe shaft can thereby be obtained.

It is also expedient, if at least one inductive element for providing a forward field of view is arranged in the detector head. In particular, the at least one inductive element is arranged on a pot core. The sensor device can then of course also look forwardly.

In principle, it is also possible for said at least one inductive element to be arranged on a mushroom core or on an I-core. A corresponding field pattern, which can be adapted and optimised for a particular application, can be produced by appropriate choice of the core.

It is expedient, if a flange portion for fixing the sensor device is provided. With the aid of the flange portion, the sensor device can be held on a utilising device such as a robotic arm for example with the aid of which the sensor device is displaceable with respect to a work piece.

It is expedient, if the length of the probe shaft is adjustable with respect to the flange portion. Hereby, the adjustment may be effected during the production of the probe shaft in that the probe shaft can be cut to length, or a definable movement of the probe shaft relative to the flange portion can be provided.

It is expedient, if an evaluating circuit is arranged in the flange portion and/or in the probe shaft so that the sensor device can deliver defined signals outwardly.

Provision may be made for the length of the probe shaft to be at least ten times greater than the diameter thereof so that deep borings (especially those having a small) diameter can also be examined.

It is possible for said at least one inductive element to be integrated into a Q-circuit. The change in the Q-factor due to the coupling with the work piece is then measured and the distance is assessed from this change in the Q-factor, whereby, in turn for example, surface testing in regard to local protuberances such as burrs can be effected.

It is also possible for the at least one inductive element to be integrated into a bridge circuit.

It is particularly advantageous if a deburring tool is arranged on the probe shaft and especially if it is arranged in the proximity of the detector head. After a burr has been detected, the burr can then be removed by means of the deburring tool. The deburring tool may be in the form of a brush for example.

The invention relates also to a sensor device for the examination of the surfaces of a work piece, in particular with regard to burrs, said device comprising a plurality of coils, a detector head having at least one sensor element in the form of a coil and an evaluating device for the sensor signals, whereby the detector head is adapted to be coupled electromagnetically to a work piece and/or the work piece is adapted to be irradiated by an electromagnetic signal from the detector head.

The detector head can thereby interact with the work piece, whereby the interaction depends, in particular, on the distance between the detector head and the work piece. A check for burrs can thus be carried out in a simple manner. The detector head forms a sensor field which is locally coupled to the work piece. Internal surfaces of the work piece can also be examined if the detector head is positioned accordingly. The examination takes place in non-contact-making manner so that a simple and in particular mechanised employment thereof is thereby possible.

In accordance with the invention, at least a first coil and a second coil are arranged adjacently in the detector head and the neighbouring first coil and second coil are arranged in a difference circuit and/or an evaluation of the difference between the signals from the first coil and the second coil is effected and/or the first coil and the second coil are triggered or driven differentially.

Such, an arrangement which is highly sensitive in regard to the examination of the surfaces of a work piece is obtained. In particular, burrs can be detected in a simple manner.

An output signal in the form of a null signal is set by the differentially-connected circuit and/or the differential control or evaluation process. To a certain extent, anti-symmetric conditions with regard to the at least two coils are set. Deviations from the symmetry of the arrangement mean that one coil is stronger coupled to the surface of a work piece than the other coil. In consequence thereof, there is a resultant finite signal. A relatively large swing in the amplitude of the signal thereby results since the relevant signal is in the form of a deviation from a null signal.

In accordance with the invention, there is provided a simple and effective arrangement for detecting whether a protuberance such as a burr is present on the surface of a work piece or whether some other anomaly is present on the surface of a work piece.

It is expedient for the first coil and the second coil to be substantially identical. In consequence, symmetrical conditions are set up whereby a null signal is then adapted to be set by a difference circuit or a difference evaluating process and corresponding deviations from the null signal are easily detectable.

In particular, the first coil and the second coil are at the same distance with respect to an effective surface of the sensor. In the event that symmetrical conditions with regard to the work piece prevail, this means that the first coil and the second coil are coupled in the same way to the work piece, or that the work piece is being subjected to the same signal by the two coils. The resultant overall signal is then a null signal in the case of a difference circuit or a difference evaluating process. Deviations again mean that "non-symmetries" are present on the surface of a work piece. In the event of such non-symmetries, these may, in particular, be burrs.

It is then expedient, if the sensor element in the form of the first coil and the sensor element in the form of the second coil have substantially the same direction of sight. In addition, it is expedient if the two coils have neighbouring fields of view which could also partly overlap. Symmetrical conditions are thereby set up so that any deviations are easily detectable.

It is advantageous if an end of the first coil facing the effective surface of the sensor lies in substantially the same plane as a corresponding end of the second coil. Corresponding symmetrical conditions are thereby produced.

For the same reason, it is expedient if a projection of a coil surface of the first coil onto a surface of the detector head, which thus determines an effective sensor area, and a projection of the corresponding coil surface of the second coil onto the surface of the detector head are located next to one another.

The projections are preferably spaced, whereby a (not too large) overlapping thereof is also possible.

In particular, the projections lie next to one another (whereby it is possible to have a partial overlapping thereof).

In the case where a coil signal is being evaluated directly, an evaluation of the effective inductance and/or the Q-factor of the coils can be effected. For example, the coils can be arranged in an oscillator circuit.

It is particularly expedient, if the first coil and the second coil are arranged in a bridge circuit. A difference circuit having (anti-) symmetrical properties can thereby be formed in a simple manner.

It is also possible for the surface of a work piece to be subjected to an electromagnetic signal by the detector head and for the reaction signal from the surface of a work piece to be determined. To this end in particular, there are provided a transmission coil device and a receiving coil device.

In one embodiment, the transmission coil device comprises transmitting coils in the form of the first coil and the second coil. The electromagnetic irradiation of the work piece is then effected (anti-) symmetrically.

In particular, the first coil and the second coil are controlled differentially in order to obtain a null signal in the case of symmetrical conditions.

It is also possible for the receiving coil device to comprise sensor elements in the form of the first coil and the second coil. In particular, a differential evaluation of the signals from the first coil and the second coil then takes place. In principle, it is also possible for both coils to be arranged directly in a difference circuit.

Provision may be made for a transmission coil and a receiving coil which is spaced therefrom in the axial direction to be provided for producing a distance signal. With the aid of these additional coils, the distance to the surface of a work piece can be determined so as to ensure for example, that a detector head can be moved over the surface of a work piece for the purposes of scanning it at a uniform distance therefrom.

Hereby, the transmission coil and the receiving coil may comprise respective active surfaces whose projection includes the projection of the active surface of the first coil and that of the second coil.

It is expedient, if the amplitude and frequency for a transmission coil are fixed. The work piece is then subjected to a defined electromagnetic signal and the change in amplitude and/or the change in phase of the received signal then contains appropriate information in regard to the surface of a work piece.

In the case of a receiving coil, provision may be made for an evaluation to be effected in regard to the amplitude of the signal. Alternatively or in addition thereto, an evaluation in regard to the phase angle could also be effected.

The following description of preferred embodiments taken in conjunction with the drawing will serve to provide a more detailed explanation of the invention.

BRIEF DESCRIPTION OF THE DRAWINGS

FIG. 4 a schematic representation of the lines of force around the detector head depicted in FIG. 3 when the detector head is inserted into a bore in a work piece and a cross-boring is present;

FIG. 5 a schematic representation of the field pattern in the case of a detector head inserted into a blind bore in a work piece;

FIG. 6 a second exemplary embodiment of a detector head;

FIG. 9(*b*) a schematic illustration of the surface of a work piece having a burr thereon;

FIG. 9(*c*) a schematic illustration of the overall signal when the detector head depicted in FIG. 9(*a*) is fed past the surface of the work piece shown in FIG. 9(*b*);

DETAILED DESCRIPTION OF THE INVENTION

Figure 1:
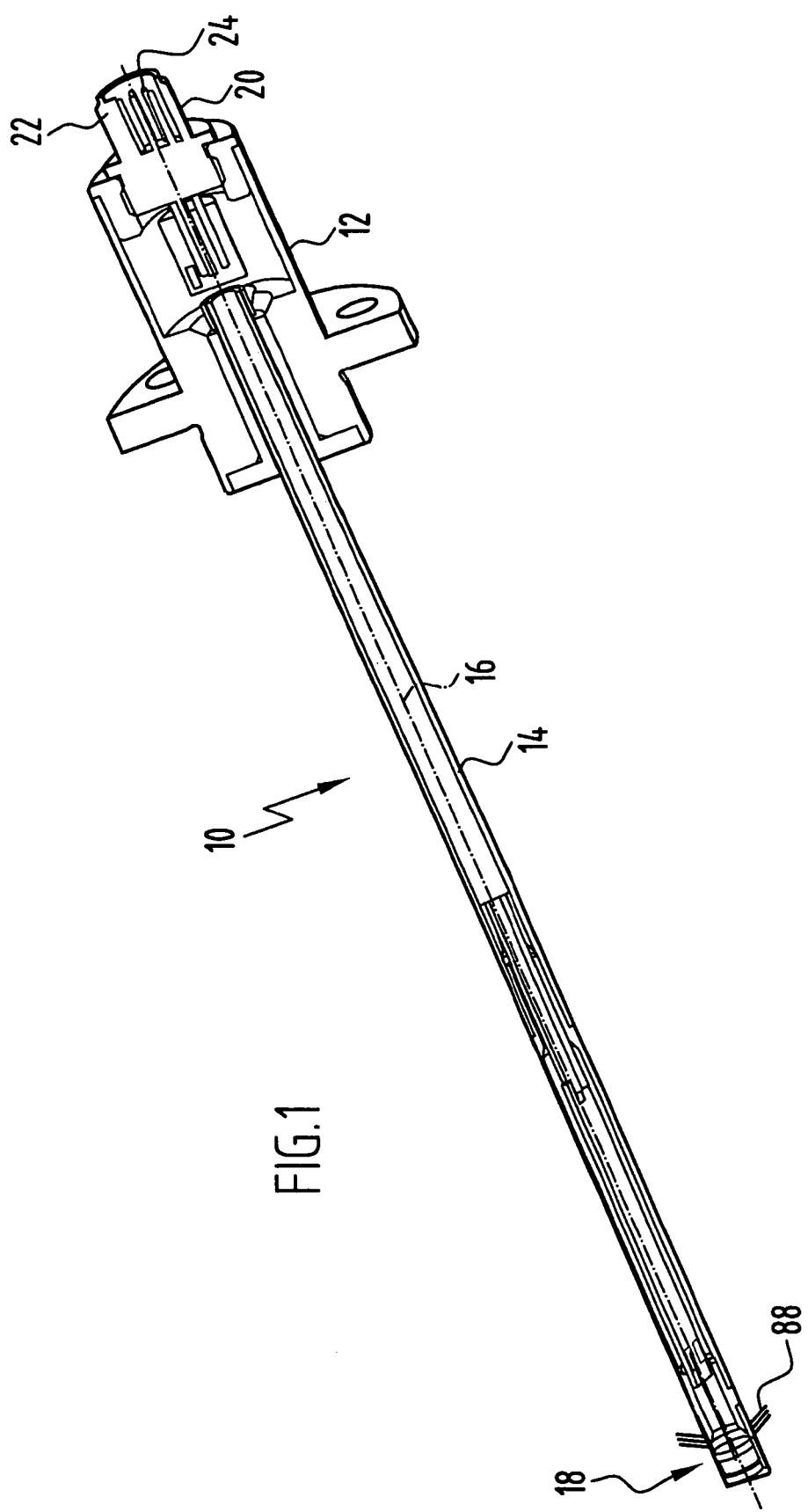
FIG. 1 shows a perspective part-sectional view of a first exemplary embodiment of a sensor device in accordance with the invention.
Figure 2:
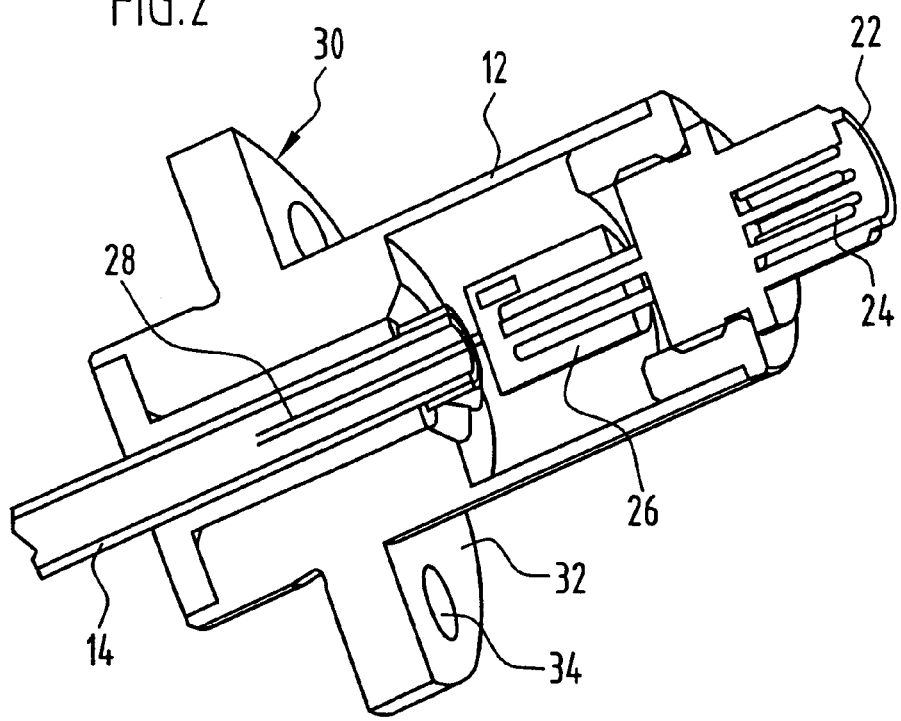
FIG. 2 an enlarged illustration of a flange portion of the sensor device depicted in FIG. 1.
Figure 3:
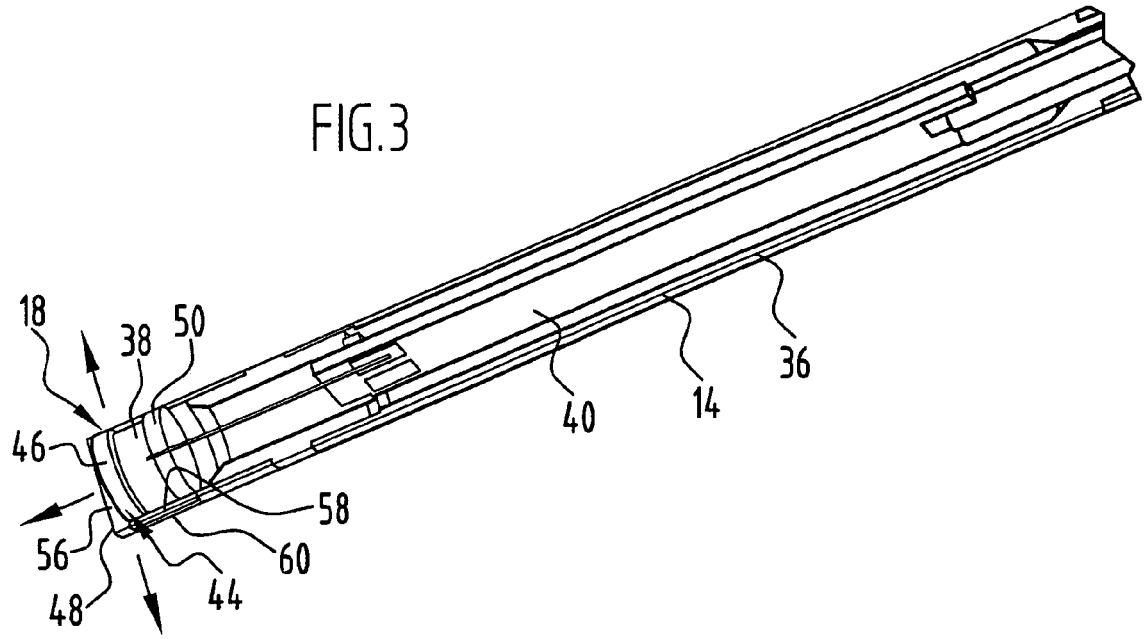
FIG. 3 an enlarged illustration of a detector head for the sensor device depicted in FIG. 1.

A first exemplary embodiment of a sensor device in accordance with the invention which bears the general reference 10 in FIG. 1 and is shown in FIGS. 1 to 3 comprises a flange portion 12 and a probe shaft 14 which is held on the flange portion 12. The probe shaft 14 has a cylindrical shape for example and extends longitudinally along a longitudinal axis 16.

The probe shaft 14 comprises a detector head 18, whereby, in particular, the detector head is arranged at one end of the probe shaft 14 and/or forms the corresponding end of the probe shaft 14. The detector head 18 is adapted to be inserted into a recess and in particular a bore in a work piece by means of the probe shaft 14 so as to enable the internal surfaces of the work piece in the recess to be examined.

The flange portion 12 is provided with an electrical connector 20 which comprises a cylindrical socket 22 having contact pins 24 arranged therein for example. The electrical connector 20 enables the sensor device 10 to be supplied with electrical energy and sensor signals can be extracted therethrough.

An evaluating circuit 26 (FIG. 2) or part of an evaluating circuit can be arranged in the flange piece 12. This is then connected to the contact pins 24 in an appropriate manner. It is also connected to the detector head 18 by one or more cables 28.

The flange portion 12 comprises a fixing device 30 such as a mounting ring 32 which is provided with borings 34 for example. The sensor device 10 can be fixed by means of the fixing device 30 to a positioning device such as a robotic arm for example, said device enabling a controlled and/or regulated approach to a work piece for the purposes of scanning it. For example, the sensor device 10 can be positioned centrally in a bore and be inserted into this boring in a controlled manner with the aid of this positioning device.

The diameter of the probe shaft 14 including the detector head 18 in a direction transverse to the longitudinal axis 16 is such that it is can be inserted into corresponding bores in a work piece. The diameter of the probe shaft 14 is preferably considerably less than the length of the probe shaft 14 along the longitudinal axis 16. In particular, the length of the probe shaft 14 is at least ten times greater than the diameter of the probe shaft 14. In one concrete exemplary embodiment, the probe shaft 14 has a diameter of 3 mm at the detector head 18.

As shown in FIGS. 1 and 2, provision may be made for the probe shaft 14 to be held firmly on the flange portion 12. It is in principle possible for the length of the probe shaft 14 to be adjustable. This can, for example, be effected during the assembly of the sensor device 10 in that the probe shaft 14 is cut to an appropriate length and then mounted on the flange portion 12. To this end, the probe shaft 14 comprises sections at which it can be cut to length. By virtue of this facility for cutting it to length, the length of the probe shaft 14 can then be adapted to the particular application.

It is also possible for the length of the probe shaft 14 to be adjusted by virtue of the portion thereof projecting beyond the flange portion 12. To this end for example, the probe shaft 14 is displaceable on the flange portion 12 in a defined manner and a specific length of the probe shaft 14 by which it projects beyond the flange portion 12 is set by the displacement position of the probe shaft 14 relative to the flange portion 12.

In principle, it is also possible for the probe shaft 14 to comprise a plurality of mutually relatively displaceable parts with the aid of which the length of the portion of the probe shaft 14 projecting beyond the flange portion 12 is adjustable in telescope-like manner.

The probe shaft 14 comprises a cylindrical housing 36 through which the cable 28 or the cables 28 are fed to one or more inductive elements 38 in the detector head 18 and/or are fed to a circuit 40 which is arranged in the housing 36, in particular, in the vicinity of the inductive element or the inductive elements 38. The circuit 40 together with the evaluating circuit 26 forms the evaluating electronic system for the sensor device 10.

In the first exemplary embodiment, a single inductive element 42 in the form of a toroidal coil is arranged in the detector head 18 (FIGS. 3 to 5). This inductive element 42 is seated on a roll core 44. This roll core 44 comprises a disk-shaped first rim 46 which faces a front distal end 48 of the probe shaft 14 or forms this end. A second disk-shaped rim 50, which is of substantially the same diameter and has the same dimensions as the first rim 46, is located opposite the first rim 46. The two rims 46 and 50 are connected by a bar-shaped element 52 (FIGS. 4 and 5). The bar-shaped element 52 has a longitudinal axis 54 (FIGS. 4 and 5), whereby the roll core 44 is formed rotationally symmetrical with respect to this longitudinal axis 54.

The inductive element 42 is seated between the two rims 46, 50 and surrounds the bar-shaped element 52, whereby it does not project beyond the rims 46, 50 and, in particular, the outer circumference thereof is set back in relation to the outer circumference of the rims 46, 50 (FIGS. 4 and 5).

The winding axis of the inductive element 42 is coaxial with the longitudinal axis 54 of the roll core 44.

The longitudinal axis 54 of the roll core 44 is coaxial with the longitudinal axis 16 of the probe shaft 14.

Provision may be made for a cap 56, which covers the roll core 44 and the inductive element 42, to be seated on the end 48 of the probe shaft 14.

In principle, it is also possible for the first rim 46 to form the distal end 48 of the probe shaft 14 especially when the roll core 44 is made of an electrically non-conductive material. In this case, provision is advantageously made for the inductive element 46 to be seated on the roll core 44 in encapsulated manner, and in particular to be surrounded by means of a moulding process so that it is mechanically protected and is also electrically isolated in relation to the environment.

Provision may also be made for a (electromagnetic) screen 58 to be arranged around the roll core 44, in particular, on an inner wall of the housing 36. This screen 58 surrounds the roll core 44 in particular. The electromagnetic coupling of the detector head 18 to a work piece can be adjusted by means of the screen. Furthermore, an orientation effect can be obtained thereby. A ferrite material or a soft-magnetic material can be used for the material for example.

Provision may be made for one or more slits 60 to be arranged in the screen 58 for breaking the rotational symmetry of the arrangement. The angular orientation of the detector head 18 in a work piece can thereby be determined absolutely.

The inductive element 42 is, in particular, part of a resonant circuit. The inductive element can be arranged in an appropriate circuit in the form of a Q-circuit or a bridge circuit. In the case of the Q-circuit arrangement, the Q-factor depends on the distance between the core-coil combination and the work piece, i.e. it depends on the strength of the inductive decoupling with respect to the work piece. The Q-factor is in fact a measure for the distance, and the distance can be determined from the evaluation of the Q-factor.

It is possible for a cable 28 to be used as a resonant circuit capacitance.

The sensor device 10 in accordance with the invention functions as follows:

The sensor device 10 is inserted into a bore 62 in a work piece 64 (FIG. 4) or into a bore 66 in a work piece 68 (FIG. 5) with the aid of the probe shaft 14.

By virtue of the inductive element 42 located on the roll core 44, the detector head 18 produces an electromagnetic field 70 which surrounds the detector head as taken with respect to the longitudinal axis 16 of the probe shaft 14, and in particular, surrounds it in a continuously interconnected manner. This electromagnetic field, which acts in all radial directions, is indicated in FIGS. 4 and 5 by the reference symbol 72. The detector head 18 thus has a field of view which surrounds the detector head 18, i.e. the detector head 18 can be coupled to the work piece 64 or 68 in non-contact-making manner in all radial directions.

The detector head 18 is in the form of a distance sensor or comprises a distance sensor which, in turn, comprises the roll core 44 and the inductive element 42, whereby the coupling of the detector head 18 to the work piece 64 or 68 is dependent on the distance between the detector head 18 and the work piece. This distance is determinable in non-contact-making manner. Surfaces and in particular the internal surfaces 74, 76 of the work piece 64 or 68 are capable of being scanned via the probe shaft 14. For example, a test for burrs can be carried out thereby; the distance sensor in the detector head 18 interacts with the work piece and the interaction depends on the distance between the distance sensor in the detector head 18 and the work piece. The sensor field of the detector head 18 is locally coupled to the work piece so that local protuberances such as burrs can in fact be detected.

The detector head 18 is inductively coupled to a metallic work piece by the electromagnetic field of the inductive element 42 whose directionality is governed in an appropriate manner by means of the roll core 44. The detector head 18 comprises an active surface which is formed by the peripheral surface of the probe shaft 14 at the detector head 18 and accordingly defines the field of view surrounding the detector head 18.

The electromagnetic field is shaped by the first rim 46 in such a way that, apart from a radial line of sight 78, the detector head 18 also has a sight direction 80 which points forwardly away from the distal end 48. This forward field of view has sight directions 80 which are substantially parallel to the longitudinal axis 16. The radial sight directions 78 are transverse, and in particular, perpendicular to these sight directions 80. Thus, the detector head 18 can also be forwardly coupled to a work piece 82 by the forward field of view. Consequently, internal surfaces 84 (FIG. 5) located transversely relative to the longitudinal direction 16 can also be examined. Such an internal surface 84 is, for example, the base of a blind boring such as that shown in FIG. 5. It can therefore be checked as to whether this base is smooth or whether burrs are present for example. Furthermore, when inserting and moving the probe shaft 14 in such a bore 66, the distance between the distal end 48 and the base can be determined and thus, for example, impingement of the detector head 18 on this base can be prevented.

Due to the arrangement of the inductive element 42 on the roll core 44, global scanning of the work piece 64 can be effected about the longitudinal axis 16. This, for example, enables the probe shaft 14 to be centralised in the corresponding boring 62 or 66 i.e. it enables coaxial alignment of the longitudinal axis 16 of the probe shaft 14 with respect to the corresponding axis of a boring. To this end for example, the probe shaft 14 is moved until such time as a maximum sensor signal ensues.

Due to the global scanning provided by the field of view surrounding the detector head 18, it is also possible to determine the diameter of a bore 62, 66 into which the detector head 18 is inserted.

At the same time, scanning in the forward direction (along the forward field of view 82) is possible. Local irregularities such as cross-borings 86 (FIG. 4) or burrs, which are formed especially in the proximity of cross-borings 86, can be detected by the distance sensor in the detector head 18 due to the local coupling thereof so that in turn, burrs are detectable and are also classifiable. This is described in DE 101 03 177 A1 and U.S. 2002/0135361 A1, to which reference is expressly made.

In this connection, provision may also be made for a deburring tool 88 (FIG. 1) to be integrated in the probe shaft 14. Here, this may be a brush for example. This brush can be supplied with electricity for example so as to form a capacitive brush for removing burrs. A detected burr can then be removed using the sensor device 10.

In principle, the distance between the detector head 18 and the work piece 68 can be determined with the aid of the forward field of view 82. As an alternative or in addition thereto, it is possible when the roll core 44 is made of an electrically conductive material for this to function as an electrode whereby the distance to the work piece is determinable in a capacitive manner. Thus, in particular, hard impingement of the detector head 18 on an internal surface of the work piece 68 can be avoided.

The first rim 46 is an active rim since it is aligned towards the work piece. (In FIGS. 4 and 5, the rim 50 is aligned towards the flange piece 12 which is in the form of a "passive" rim.) It is possible for the second rim 50 to be metallised in order to provide for an improved orientation of the field or focusing of the field with respect to the field of view of the detector head 18. Provision may also be made for at least a part of the evaluating circuit to be arranged on the second rim 50.

Very small probe diameters can be attained when using a roll core 44. For example, a probe shaft 14 having a diameter of 3 mm can be realized. When the roll core 44 is made from an electrically non-conductive material such as a non-conductive ferrite for example, it is also possible to dispense with the cap 56. Small dimensions can thereby be achieved.

The detector head 18 comprises a radial field of view and a forward field of view 82 due to the use of a roll core 44. It is in principle possible to make a separation between these fields of view and thus enable switching between the fields of view.

If the roll core 44 is made of a conductive material, then it can be used as an electrode. It is thereby possible to carry out a capacitive distance measurement both forward and laterally. Consequently, one can select between performing an inductive distance measurement, a capacitive distance measurement or a combined inductive-capacitive distance measurement.

A plurality of inductive elements 92, 94, 96 is provided in a second exemplary embodiment of a detector head which is schematically shown in FIG. 6 and bears the general reference 90 therein. Here, there is provided a plurality of inductive elements 92, 94 which are distributed around the longitudinal axis 16 of the probe shaft 14. An active surface and a field of view are thereby made available, the latter surrounding the detector head 90 with respect to the longitudinal axis 16. For example, there are provided three inductive elements which are mutually displaced by 120°. Provision could also be made for four inductive elements which are mutually displaced by 90°, for five inductive elements which are mutually displaced by 72°, and so on.

In the exemplary embodiment shown, the inductive elements 92, 94 are each seated on a pot core 98 for defining a radial field of view. This pot core has the shape of a large E. A bowl 100 having a central element 102 is formed by the pot core 98, said central element 102 being bar-shaped. The inductive element 92 is seated in the bowl 100 and is wound around the central element 102. Hereby, the bowl 100 is outwardly open in the radial direction. A transverse direction perpendicular to the longitudinal direction 16, which is coaxial with the axis of the central element 102, corresponds to the winding axis of the inductive element 92.

The inductive element 92, which is seated on the pot core 98, defines a (local) field of view having an active surface which substantially corresponds to the diameter of the pot core (along the longitudinal axis 16). A (global) field of view, which surrounds the longitudinal axis 16, is then produced by the plurality of inductive elements 92, 94. In particular, at least three inductive elements 92 are provided.

For each individual inductive element 92, 94 and so on, the pot core 98 can be adapted in such a way that the electromagnetic fields of neighbouring inductive elements overlap thus resulting in a continuous field of view about the longitudinal axis 16. It is also possible for the fields of view of neighbouring inductive elements 92 not to overlap so that the entire (global) lateral field of view comprises interruptions.

Furthermore, a forward field of view is formed by an inductive element 96 on a pot core 104. Here, the inductive element 96 and the pot core 104 are seated in the proximity of a distal end 106 of the probe shaft. One can in fact look forwardly with the aid of this inductive element 96 in order to thereby determine the distance to the work piece in the forward direction so as to avoid a hard impingement for example. Internal surfaces facing the distal end 106 can also be examined by means of this arrangement.

Figure 7:
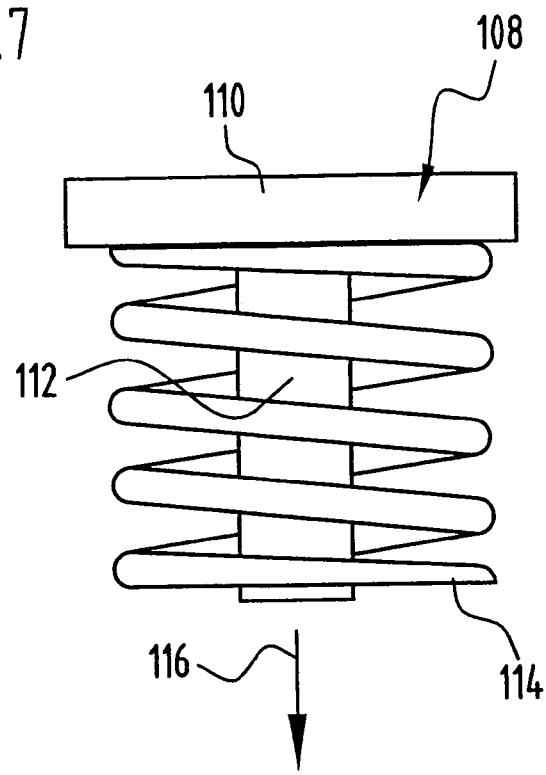
FIG. 7 a schematic illustration of a mushroom core having an inductive element arranged thereon.
Figure 8:
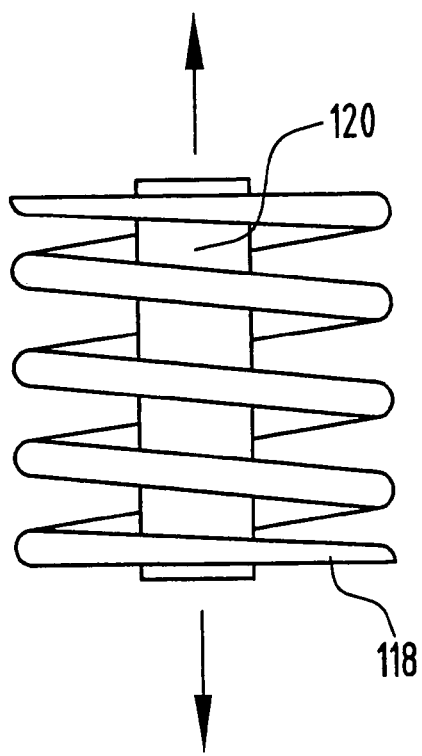
FIG. 8 a schematic illustration of an I-core having an inductive element arranged thereon.

Instead of using a pot core for the inductive elements 92, 94, 96, provision could also be made for the use of other shapes of core such as a mushroom core 108 (FIG. 7) for example. This comprises a rim 110 upon which a pin element 112 is seated. An inductive element in the form of a toroidal coil 114 is wound around the pin element 112.

The combination of a mushroom core 108 and an inductive element 114 provides a field of view in a main direction 116 which is parallel to a longitudinal axis of the pin element 112.

It is also possible to have an inductive element 118 located on an I-core 120. The field of view of such a coil-core combination is substantially in the form of a cylindrical region extending forwardly and rearwardly on the core 120.

One exemplary embodiment of a sensor device in accordance with the invention comprises a detector head 130 such as is shown schematically in FIG. 9(*a*). The detector head can be arranged at the end of a probe shaft for example. An evaluating device 132 for the sensor signals is provided. This can be arranged in the detector head or spaced with respect thereto on a flange for a probe shaft for example.

A first coil 136 and a second coil 138 are arranged in the vicinity of a front end 134 (sensor end) of the detector head 130. (The coils are schematically indicated by a single turn in FIG. 9(*a*).) The two coils 136, 138 are seated adjacently next to one another. Their effective coil surfaces 140, 142 are thereby located substantially in the same plane and are parallel to an end face of the detector head 130 which forms the front end 134. The effective coil surfaces 140, 142 are substantially perpendicular to the respective coil axes of the coils 136, 138.

The two coils 136, 138 are substantially identical and are arranged in the detector head such as to be mirror-symmetrical with respect to an axis 144 of the detector head 130.

The two coils 136, 138 are arranged in a bridge circuit, i.e. they are arranged in a difference circuit. This means that a resultant signal, which is derivable by the evaluating device 132 and represents the: overall signal from the coil arrangement consisting of the first coil 136 and the second coil 138, will be a null signal if the two coils 136, 138, taken with reference to a work piece 146, are coupled to this work piece 146 in the same way.

The evaluation in regard to the two coils 136, 138 or in regard to the double coil combination is effected using the Q-factor of the coils and/or the effective inductance of the coils for example.

Figure 9A:
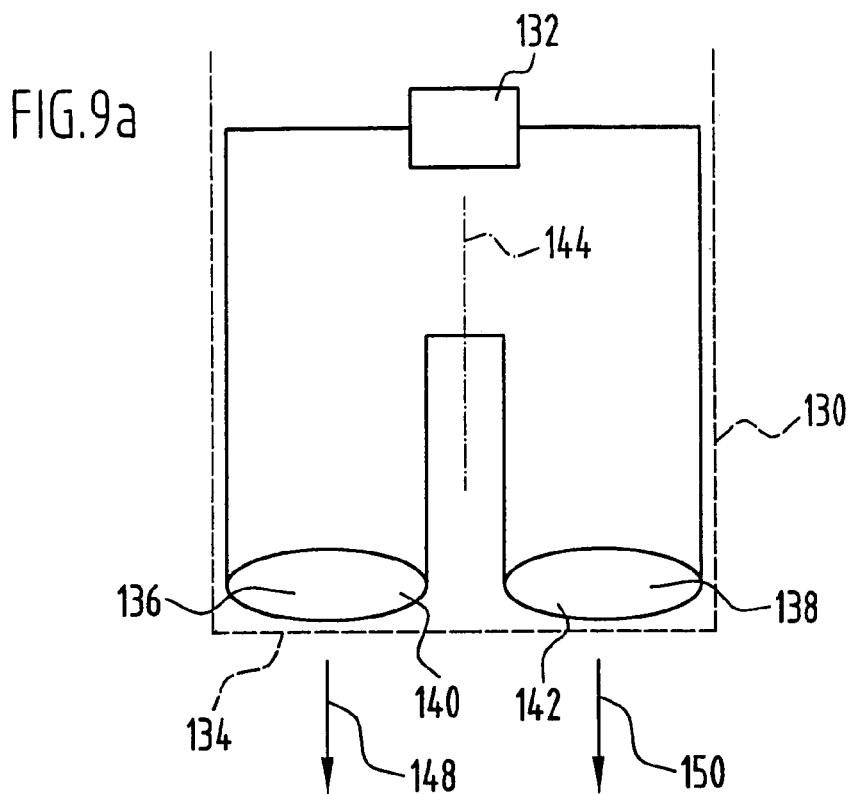
FIG. 9(*a*) a schematic view of a further exemplary embodiment of a detector head for a sensor device in accordance with the invention having two coils.

The two coils 136, 138 have a forward direction of sight (indicated by the arrows 148 and 150 in FIG. 9(a)). The two directions of sight 148, 150 are substantially parallel. The corresponding fields of view of the two coils 136, 138 lie side by side, whereby partial overlapping of the fields of view is possible.

Due to the (anti-symmetric) wiring of the two coils 136, 138, one obtains a null signal if the symmetry is not disturbed. However, if the symmetry is disturbed, for example by a protuberance from the surface of the work piece such as a burr 152 (FIG. 9(b)), then the coupling to one of the two coils 136, 138 is greater than it is to the other coil so that a signal deviating from the null signal thereby results.

Consequently, the sensor device is highly sensitive since just deviations from a null signal are detectable.

Figure 9B:
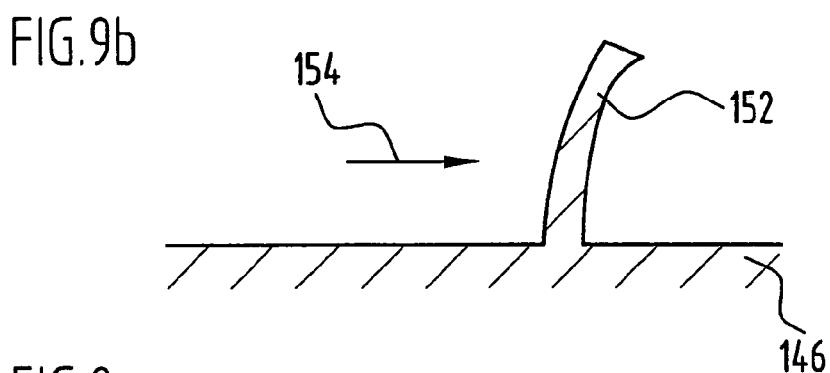
Figure 9C:
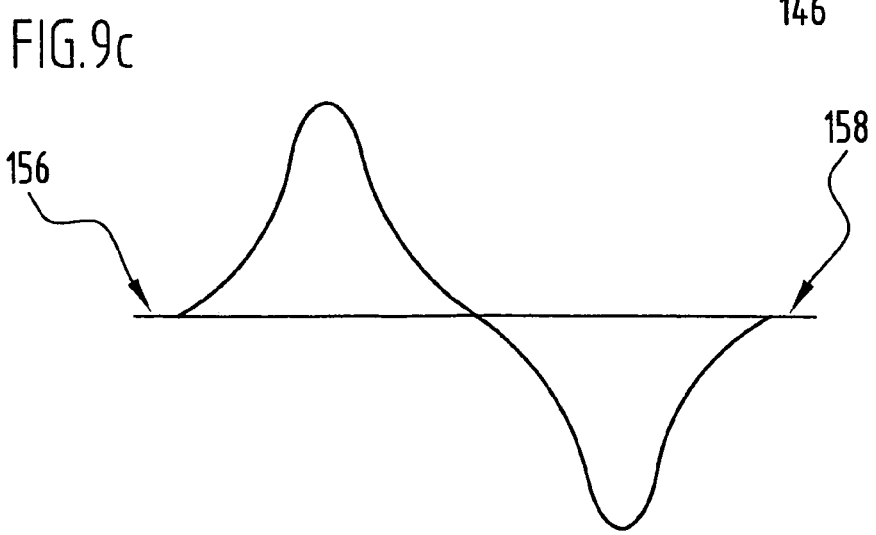

FIG. 9(c) depicts a position-dependent resultant overall signal in the case where the detector head 130 in accordance with FIG. 9(a) is moved over the work piece 146 in the direction 154 (FIG. 9(b)). At a position far from the burr 152, the difference signal from the two coils 136, 138 is a null signal (regions 156 and 158 in FIG. 9(c)). When the second coil 138 comes in range of the burr 152, it then experiences a greater coupling to the work piece 146 thereby resulting in a maximum at a certain position. In the course of further movement of the detector head 130, the coupling to the second coil 138 becomes weaker whilst the coupling to the first coil 136 increases. A maximum then reoccurs at a certain position, this being caused by the coupling to the first coil 136 of course. Since the two coils 136, 138 are arranged in a difference circuit, the maxima caused by the two coils 136, 138 have different prefix signs.

Figure 10:
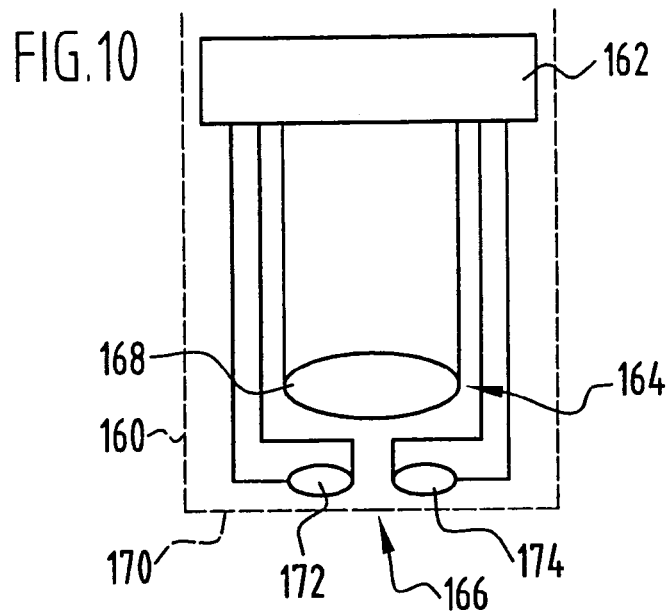
FIG. 10 a further exemplary embodiment of a detector head including one transmission coil and two receiving coils.

A detector head 160 is provided in a further exemplary embodiment which is shown in FIG. 10. Furthermore, an evaluating device 162 is provided which can be arranged in the detector head 160 or outside it. In this exemplary embodiment, the detector head 160 comprises a transmission coil device 164 and a receiving coil device 166. An electromagnetic signal is applied to a work piece by the transmission coil device. An electromagnetic reaction signal from the work piece is received by the receiving coil device 166 and the corresponding signals from the receiving coil device 166 are evaluated by the evaluating device 162. The reaction signal from the surface of a work piece is determined by the structure of the surface of the work piece. In particular thereby, the presence of burrs is detected and a process of classifying the detected burrs is carried out.

The transmission coil device 164 comprises one or more coils (as will be described below) whereby, in particular, the amplitude and frequency with regard to the transmission coils are defined. As regards the receiving coil in the receiving coil device 166, the amplitude and/or the phase angle are evaluated thereby.

In the example shown in FIG. 10, the transmission coil device 164 comprises a coil 168 whose coil surface is aligned substantially parallel to an end face 170 of the detector head 160.

The receiving coil device 166 comprises sensor elements in the form of a first coil 172 and a second coil 174 which are arranged next to each other. The coils 172 and 174 are preferably substantially identical. They are preferably arranged to be (mirror) symmetrical with respect to an axis of the detector head 160.

Hereby, provision is made for the receiving coils 172, 174 to be arranged within the field of view of the transmission coil 168. In particular, the rim of a projection of the effective transmission surface of the coil 168 onto the end face 170 surrounds the corresponding projections of the effective receiving surfaces of the coils 172 and 174.

The two coils 172, 174 are arranged in a difference circuit or a differential evaluation of the sensor signals from these two coils 172, 174 is effected. The advantages described above thereby ensue, namely, that the arrangement supplies a null signal in the case of symmetrical conditions whereas in the case of deviations therefrom, if burrs are present for example, a signal sensitive to "disturbances" such as burrs is supplied.

Figure 11:
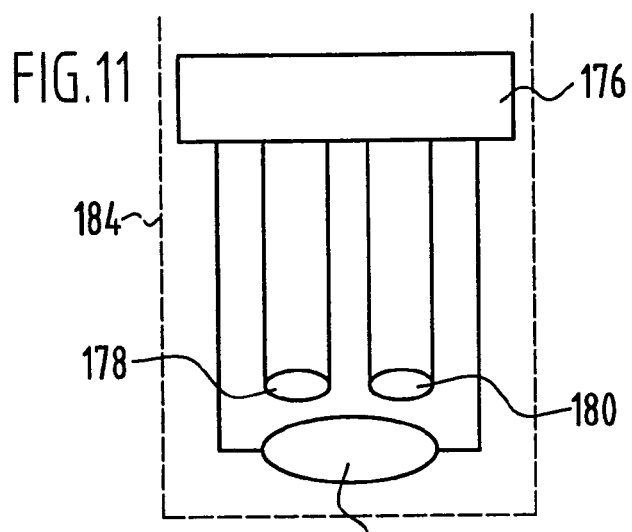
FIG. 11 an exemplary embodiment of a detector head including two transmission coils and one receiving coil and FIG. 12 a variant of the embodiment depicted in FIG. 11 having an additional transmission coil and receiving coil for determining the spacing.

An evaluating device 176 is provided in a further exemplary embodiment which is shown in FIG. 11. The transmitter device comprises a first coil 178 and a second coil 180. The receiving coil device comprises a single coil 182. The two coils 178, 180 (the transmission coils) are controlled by the evaluating device 176, whereby the coils are controlled differentially. To this end, the two coils 178, 180 are arranged in a difference circuit for example, but of course, the controlling process could be effected anti-symmetrically.

The receiving coil 162 receives reaction signals from the work piece, whereby the resulting signal is once again a null signal in the case of symmetrical conditions. A finite signal will result in the event of deviations with respect to the symmetry of the arrangement on the surface of a work piece. As mentioned above, the signal from the coil 182 serving as a receiving coil is evaluated with regard to amplitude and/or phase, whereby the signals transmitted by the coils 178, 180 are of fixed amplitude and fixed frequency.

Otherwise, the sensor device and its detector head 184 in accordance with FIG. 11 function as described above.

Figure 12:
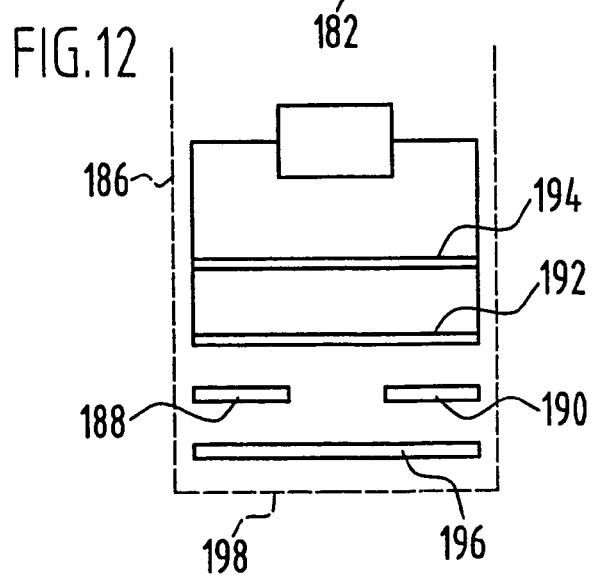

In a further example which is shown in FIG. 12 and is essentially based on the example in accordance with FIG. 10, a neighbouring second receiving coil 190 is arranged in a detector head 186 in addition to a first receiving coil 188, whereby the two coils are arranged in a difference circuit or the signals from the coils are evaluated differentially, and there is an associated transmission coil 192 and also an additional transmission coil 194 and an associated receiving coil 196. The transmission coil 194 and the receiving coil 196 are axially spaced. For example, taken with reference to an end face 198 of the detector head 186, the receiving coil 196 is located in the vicinity of this end face and, of all the coils, the transmission coil 194 lies at the greatest distance from this end face 198 so that the transmission coil 192 and the receiving coils 188, 190 are arranged between the transmission coil 194 and the receiving coil 196.

Provision is made, in particular, for the transmission coil 194 to transmit signals at a frequency differing from that used by the transmission coil 192.

Due the coil combination between the transmission coil 194 and the receiving coil 196, it is possible to determine the distance of the detector head 186. With the aid of the coil combination comprising the transmission coil 192 and the receiving coils 188, 190, it is possible to scan the surface of a work piece, in particular, for the purposes of detecting burrs. With the aid of the transmission coil and receiving coil combination consisting of the coils 194, 196, it is possible to determine the distance so as, for example, to maintain the detector head 186 at a certain distance above a work piece and enable it to be moved over the work piece at this distance.

The invention claimed is:

1. A sensor device for the examination of the surfaces of a work piece, comprising:
   a probe shaft having a detector head with at least one inductive element adapted to inductively couple to the work piece;
   wherein said at least one inductive element is constructed and arranged such that the detector head has a field of view surrounding the probe shaft with regard to the longitudinal axis of the probe shaft, the field of view comprising a plurality of sight directions transverse to the longitudinal direction of the probe shaft.

2. A sensor device in accordance with claim 1, wherein the coupling of the detector head to the work piece is dependent on the distance between the detector head and the work piece.

3. A sensor device in accordance with claim 1, wherein the distance between the work piece and the detector head is determinable in non-contact-making manner.

4. A sensor device in accordance with claim 1, wherein the detector head is in the form of a distance detector comprising one or more distance sensors.

5. A sensor device in accordance with claim 1, wherein said at least one inductive element is constructed and arranged in such a manner that the distance to the work piece is determinable in radial directions.

6. A sensor device in accordance with claim 1, wherein said at least one inductive element is arranged on a roll core.

7. A sensor device in accordance with claim 1, wherein the field of view around the detector head extends over a range of 360°.

8. A sensor device in accordance with claim 1, wherein the field of view is substantially rotationally symmetrical with respect to the longitudinal axis of the sensor shaft.

9. A sensor device in accordance with claim 1, wherein said at least one inductive element produces an electromagnetic field which is effective about the detector head in all transverse directions taken with respect to the longitudinal direction of the probe shaft.

10. A sensor device in accordance with claim 1, wherein the electromagnetic field around the detector head is continuously interconnected.

11. A sensor device in accordance with claim 1, wherein the field of view around the detector head is continuously interconnected.

12. A sensor device in accordance with claim 1, wherein an active surface of the detector head via which the detector head is coupled to the work piece comprises a circumferential surface of the detector head.

13. A sensor device in accordance with claim 1, wherein said at least one inductive element is constructed and arranged in such a manner that a field of view extends forwardly from a distal end of the probe shaft.

14. A sensor device in accordance with claim 13, wherein the forward field of view has a sight direction substantially parallel to the longitudinal axis of the probe shaft.

15. A sensor device in accordance with claim 13, wherein an active surface, via which the detector head is coupled to the work piece, at least partly comprises an end face of the detector head.

16. A sensor device in accordance with claim 1, wherein the detector head is arranged in the area of a distal end of the probe shaft.

17. A sensor device in accordance with claim 1, wherein the detector head forms the distal end of the probe shaft.

18. A sensor device in accordance with claim 1, wherein said at least one inductive element is in the form of a toroidal coil.

19. A sensor device in accordance with claim 1, wherein said at least one inductive element is arranged on a core.

20. A sensor device in accordance with claim 6, wherein a longitudinal axis of the roll core is aligned substantially parallel to the longitudinal axis of the probe shaft.

21. A sensor device in accordance with claim 6, wherein a coil axis of said at least one inductive element is substantially coaxial with the longitudinal axis of the roll core.

22. A sensor device in accordance with claim 6, wherein the roll core comprises an active rim which is oriented towards one end of the detector head or forms an end of the detector head.

23. A sensor device for the examination of the surfaces of a work piece, comprising:
   a probe shaft having a detector head with at least one inductive element arranged on a roll core and adapted to inductively couple to the work piece; wherein:
   the at least one inductive element is constructed and arranged such that the detector head has a field of view surrounding the probe shaft with regard to the longitudinal axis of the probe shaft,
   the roll core comprises an active rim oriented towards one end of the detector head or forming an end of the detector head, and
   the roll core comprises a passive rim which is located opposite the active rim.

24. A sensor device in accordance with claim 23, wherein the field of view comprises a plurality of sight directions transverse to the longitudinal direction of the probe shaft.

25. A sensor device in accordance with claim 23, wherein the passive rim is at least partly metallized.

26. A sensor device in accordance with claim 23, wherein the passive rim carries at least a part of an evaluating circuit.

27. A sensor device in accordance with claim 6, wherein the inductive element is encapsulated on the roll core.

28. A sensor device in accordance with claim 19, wherein the core is made of an electrically non-conductive material.

29. A sensor device in accordance with claim 19, wherein the core is made of an electrically conductive material.

30. A sensor device in accordance with claim 29, wherein the core is used as an electrode for the purposes of determining the distance capacitively.

31. A sensor device in accordance with claim 19, wherein a screen is provided for the core.

32. A sensor device in accordance with claim 31, wherein the screen surrounds the core.

33. A sensor device in accordance with claim 31, wherein the screen is substantially rotationally symmetrical with a symmetry break.

34. A sensor device in accordance with claim 33, wherein the symmetry break is produced by means of a slit in the screen.

35. A sensor device in accordance with claim 1, wherein the detector head comprises a single inductive element in the form of a field-generating element.

36. A sensor device in accordance with claim 1, wherein a plurality of inductive elements are arranged in the detector head.

37. A sensor device in accordance with claim 36, wherein a plurality of inductive elements distributed around the longitudinal axis of the probe shaft are arranged in the detector head.

38. A sensor device in accordance with claim 37, wherein the respective inductive elements are arranged on a pot core.

39. A sensor device in accordance with claim 36, wherein at least one inductive element for providing a forward field of view is arranged in the detector head.

40. A sensor device in accordance with claim 39, wherein said at least one inductive element is arranged on a pot core.

41. A sensor device in accordance with claim 39, wherein said at least one inductive element is arranged on a mushroom core.

42. A sensor device in accordance with claim 39, wherein said at least one inductive element is arranged on an I-core.

43. A sensor device in accordance with claim 1, wherein there is provided a flange portion for fixing the sensor device.

44. A sensor device in accordance with claim 43, wherein the length of the probe shaft is adjustable with respect to the flange portion.

45. A sensor device in accordance with claim 43, wherein an evaluating circuit is arranged in at least one of the flange piece and in the probe shaft.

46. A sensor device in accordance with claim 1, wherein the length of the probe shaft is at least ten times greater than the diameter thereof.

47. A sensor device in accordance with claim 1, wherein said at least one inductive element is integrated into a Q-circuit.

48. A sensor device in accordance with claim 1, wherein said at least one inductive element is integrated into a bridge circuit.

49. A sensor device for the examination of the surfaces of a work piece, comprising:
- a probe shaft having a detector head with at least one inductive element adapted to inductively couple to the work piece;

wherein:
- the at least one inductive element is constructed and arranged such that the detector head has a field of view surrounding the probe shaft with regard to the longitudinal axis of the probe shaft, and
- a deburring tool is arranged on the probe shaft.

* * * * *